United States Patent [19]

Conley

[11] Patent Number: 4,878,155

[45] Date of Patent: Oct. 31, 1989

[54] HIGH SPEED DISCRETE WIRE PIN PANEL ASSEMBLY WITH EMBEDDED CAPACITORS

[76] Inventor: Larry R. Conley, 11146 Blue Allium, Fountain Valley, Calif. 92709

[21] Appl. No.: 252,260

[22] Filed: Sep. 30, 1988

Related U.S. Application Data

[63] Continuation-in-part of Ser. No. 100,937, Sep. 25, 1987, abandoned.

[51] Int. Cl.$^4$ .............................................. H05K 1/18
[52] U.S. Cl. ..................................... 361/401; 174/68.5
[58] Field of Search ............... 361/401; 174/72 B, 68.5

[56] References Cited

U.S. PATENT DOCUMENTS

| H416 | 1/1988 | Colvin | 361/398 |
|---|---|---|---|
| 3,191,098 | 6/1965 | Fuller | 174/68.5 X |
| 3,266,125 | 8/1966 | Tobolski | 29/155.5 |
| 3,290,756 | 12/1966 | Dreyer | 29/155.5 |
| 3,384,955 | 5/1968 | Pierce | 29/624 |
| 3,529,212 | 9/1970 | Ballard | 317/101 |
| 3,983,458 | 9/1976 | Jordan et al. | 361/401 |
| 4,109,295 | 8/1978 | Rostek et al. | 361/401 |
| 4,328,530 | 5/1982 | Bajorek et al. | 361/401 X |
| 4,346,257 | 8/1982 | Moss et al. | 174/72 B |
| 4,436,953 | 3/1984 | Gottlieb | 174/72 B |
| 4,440,972 | 4/1984 | Taylor | 174/72 B |
| 4,494,172 | 1/1985 | Leary et al. | 174/68.5 X |
| 4,584,768 | 4/1986 | Tosti | 29/872 |
| 4,598,337 | 7/1986 | Wuthrich et al. | 361/401 |
| 4,628,527 | 12/1986 | Henneberger | 361/401 X |
| 4,800,459 | 1/1989 | Takagi et al. | 361/401 X |

FOREIGN PATENT DOCUMENTS

| 2067825 | 7/1971 | France | 361/401 |
|---|---|---|---|
| 1266632 | 3/1972 | United Kingdom | 174/260 |

Primary Examiner—R. R. Kucia
Attorney, Agent, or Firm—Freilich, Hornbaker, Rosen & Fernandez

[57] ABSTRACT

Decoupling capacitance is provided with negligible inductance in a high speed discrete wire logic panel by the use of SMT (surface mounting) capacitors that are mounted in holes in the circuit board. A hole is formed in the circuit board under each location where a dual-in-line IC (integrated circuit) is to be mounted, and an SMT capacitor is mounted in the hole, with the opposite terminals of the capacitor soldered to the conductive layers on opposite board surfaces. Each quantity of solder extends substantially in the plane of a corresponding conductive layer. Only one side of each capacitor terminal is soldered to a conductive layer, to permit flux washout. In the PGA (pin grid array) area of the circuit board, a capacitor is selectively mounted under an IC by removing a pin from a hole lying under the pin-free area in the center of the IC, and installing a capacitor in the hole.

12 Claims, 3 Drawing Sheets

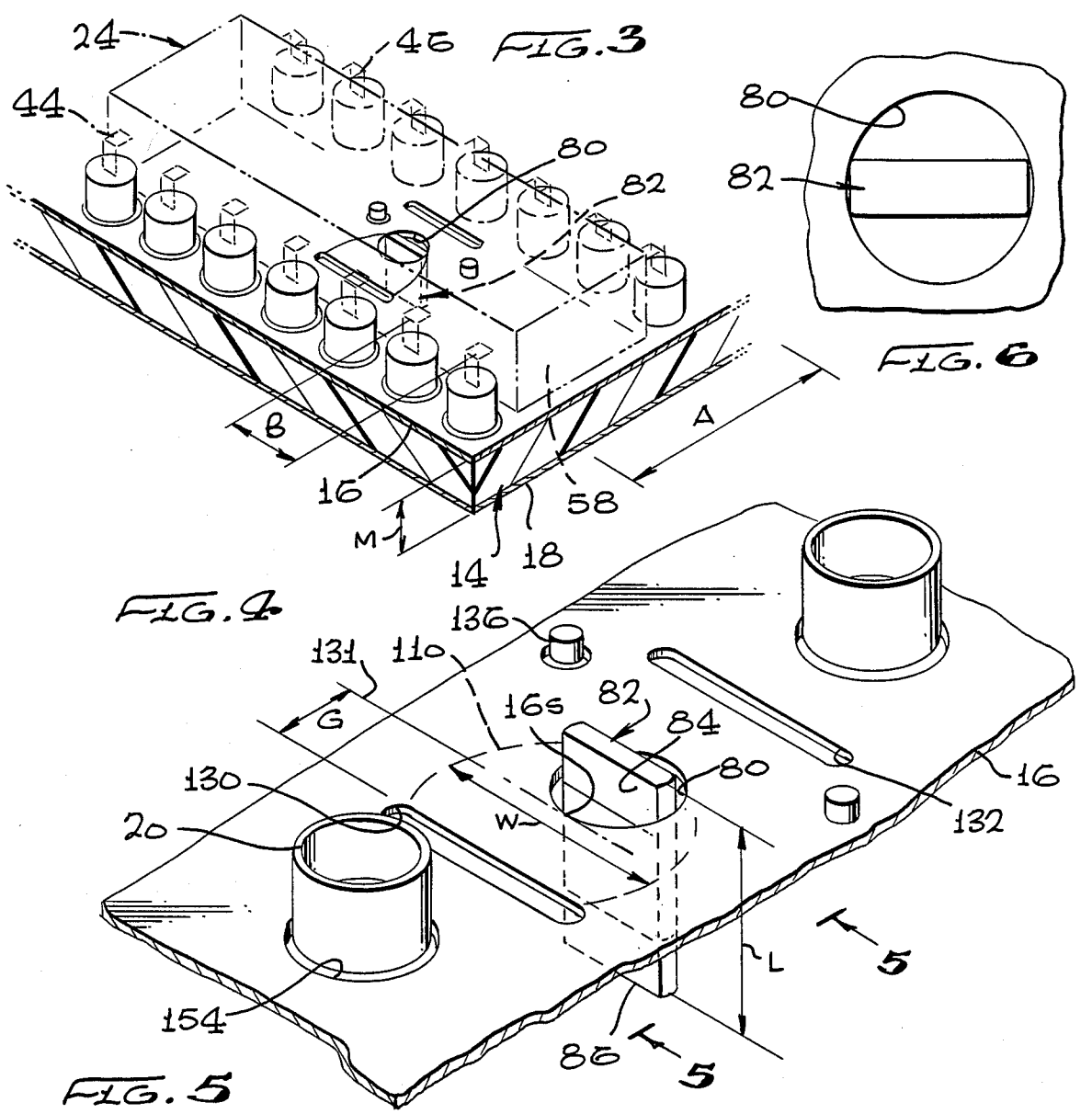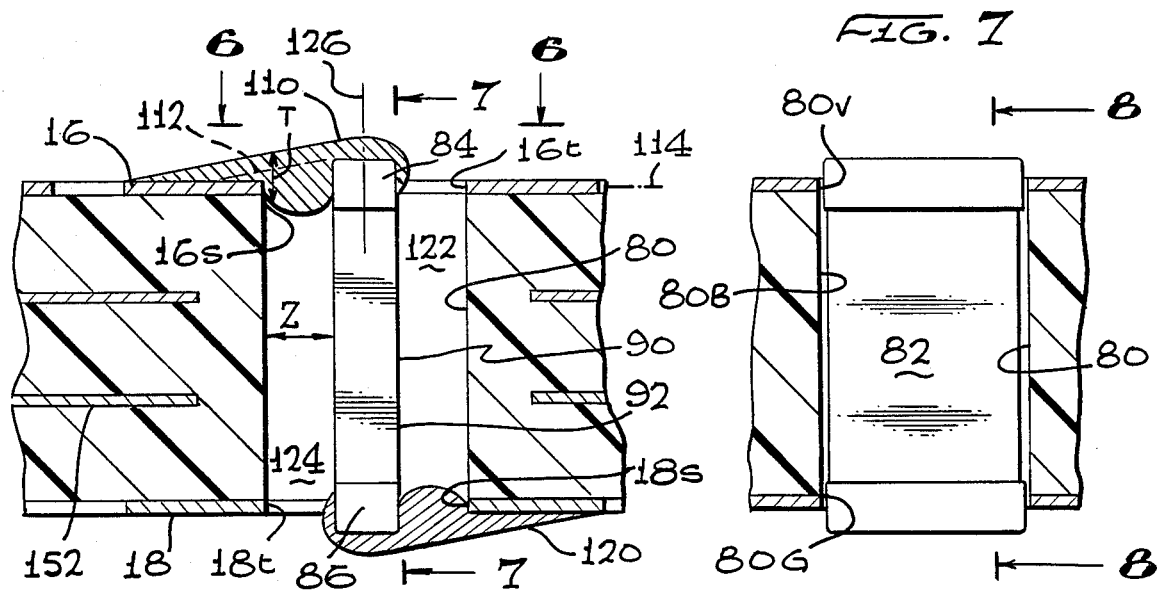

(NON-LOGIC PANEL)

(LOGIC PANEL)

HIGH SPEED DISCRETE WIRE PIN PANEL ASSEMBLY WITH EMBEDDED CAPACITORS

CROSS-REFERENCE

This is a continuation-in-part of application Ser. No. 07/100,937 filed Sept. 25, 1987, now abandoned.

BACKGROUND OF THE INVENTION

High speed digital integrated circuits are typically mounted on logic panels to interconnect the leads of the different IC's (integrated circuits). Each logic panel includes a core of insulative material and two conductive layers, each covering most of the surface of a corresponding face of the core. These layers are used to distribute various voltages and system ground directly to or close to each integrated circuit and are generally referred to as voltage and ground planes. IC's are generally plugged into machined sockets so the IC's lie over the voltage plane, and that side of the panel is referred to as the component side. The wires that interconnect selected socket pin terminals with plugged-in IC leads generally lie over the ground plane, and that side of the panel is referred to as the wiring side. Numerous decoupling capacitors are commonly mounted on the logic panel close to the integrated circuits, each capacitor extending between the voltage and ground planes to filter out noise. It is important that the connections between the capacitor terminals and the voltage and ground planes avoid the introduction of significant inductances. An inductance in series with a decoupling capacitor, and connecting the voltage and ground planes, would result in an LC resonance at a particular high frequency. A circuit formed on the logic panel cannot operate at frequencies near such a resonance, since operation near a resonant frequency would create unacceptable noise.

SMT (surface mounted) capacitors have become widely used to filter electrical noise in logic panels. The SMT's are commonly mounted on the component side of a logic panel beneath plug-in integrated circuits. One terminal of the capacitor lies on and is soldered to the voltage plane. The other terminal of the capacitor is soldered to a separate conductive trace that leads to a plated-through hole in the board, that connects to the ground plane on the wiring side of the board. Logic panels with such SMT capacitors have been found useful to frequencies up to about 90 MHz (megahertz), but are found to produce inductances that prevent their use above 100 MHz. For higher frequencies, designers have had to resort to stripline and microstrip boards where the etched conductive traces are designed to act somewhat like waveguides or transmission lines. Such stripline and microstrip boards have permanently etched circuit traces, are much more expensive to design and manufacture in small quantities, and do not easily allow for discrete wire connections (wherein any lead of any plug-in integrated circuit can be connected to any other lead of another integrated circuit, to permit circuit changeability).

SMT's are often soldered onto the logic panel, beneath plug-in integrated circuits, so they occupy a space that might otherwise be wasted and lie very close to the integrated circuit power connections. However, such capacitor mounting gives rise to problems. One problem is that solder flux is often trapped in the narrow gap between the SMT capacitor body and the metal foil conductive layer on the surface of the circuit board. Difficult cleaning techniques are required because even traces of flux residue can cause serious corrosion when exposed to humidity. Another problem is that SMT capacitors require expensive machines to place them on the circuit board and to solder them in place. SMT capacitors and connecting solder joints can also be broken or conductive traces cracked when the plug-in integrated circuits over them are pried out of the sockets. A single shorted capacitor renders the entire logic panel useless until repaired and damaged SMT capacitors are difficult to detect. A decoupling capacitor mounting arrangement which avoided the creation of appreciable inductances, to thereby enable logic panels to operate at higher speeds, would be of considerable value. Such a capacitor mounting arrangement which also protected the capacitors from harm, all in a system which enabled low cost placement and electrical connection of the capacitors, would be of considerable value.

SUMMARY OF THE INVENTION

In accordance with one embodiment of the present invention, a logic panel with decoupling capacitors mounted thereon is provided, wherein the capacitors are mounted so they are resistant to the creation of inductances, are resistant to damage, and are easily mounted with high reliability at low cost. Each capacitor is leadless, with the conductive terminal at each of its opposite ends generally in the form of a wide but thin conductive layer or coating. Each capacitor lies in a hole in the circuit board with the opposite capacitor terminals lying at about the same height as the voltage and ground planes, and each capacitor terminal is coupled to a corresponding logic (voltage or ground) plane by a quantity of conductive material such as heat-melting solder extending primarily parallel to the conductive plane. This arrangement avoids the creation of unwanted inductances.

A quantity of solder on each end of the capacitor, extends from the capacitor to only one side of the hole in the corresponding conductive layer, to thereby leave the opposite side of the hole open. This allows the passage of solder flux washout fluid through the hole after the capacitor is installed, to thoroughly wash out solder flux. The conductive layer preferably includes a thermal relief slot spaced from the capacitor-receiving hole, and the quantity of solder extends up to but not beyond the slot.

The logic panel is preferably a discrete wire pin panel assembly having numerous pin-receiving holes. Each pin has a component side which receives a lead of an integrated circuit, and has a wiring side which connects to the wire that extends to another pin. One portion of the logic panel can include a pin grid array (PGA) section where the pins lie in holes arranged in multiple rows and columns at uniform spacings. Integrated circuits of a variety of sizes can be installed in the grid array section, with their leads received in corresponding pins. The central pin-free area under each PGA integrated circuit, lies over several holes from which an unused socket pin can be removed and replaced by a decoupling capacitor.

The novel features of the invention are set forth with particularity in the appended claims. The invention will be best understood from the following description when read in conjunction with the accompanying drawings.

BRIEF DESCRIPTION OF THE DRAWINGS

FIG. 3 is a perspective view of a portion of the assembly of FIG. 1, showing in phantom lines an installed dual-in-line integrated circuit.

FIG. 4 is an enlarged view of a portion of the assembly of FIG. 3, with the mass of solder shown in phantom lines.

FIG. 5 is a view taken on the line 5—5 of FIG. 4.

FIG. 6 is a view taken on the line 6—6 of FIG. 5, but without the solder in place.

FIG. 7 is a view taken on the line 7—7 of FIG. 5, but without the solder in place.

DESCRIPTION OF THE PREFERRED EMBODIMENTS

Figure 1:
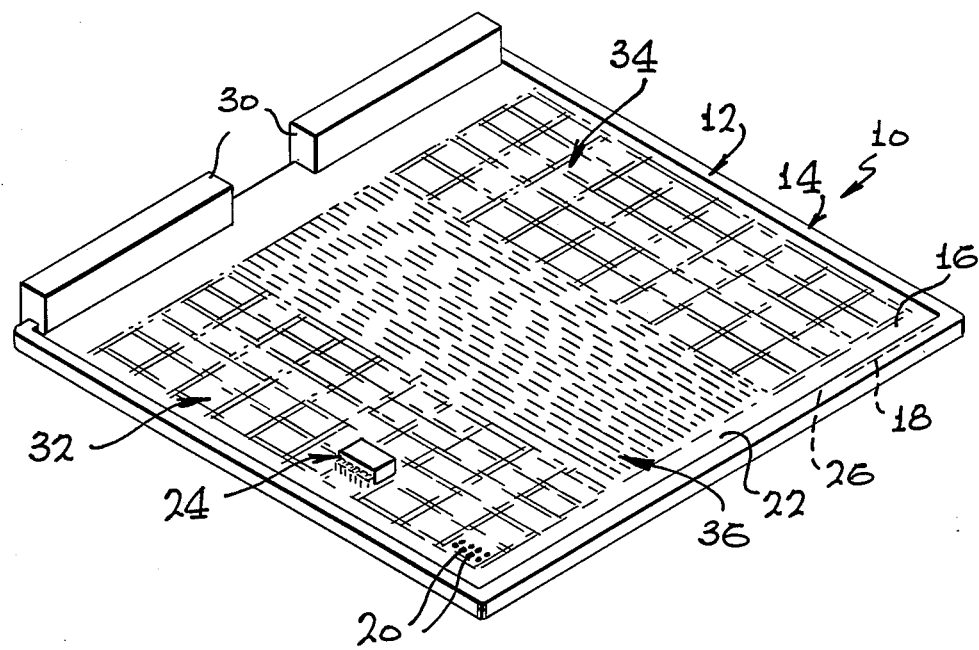
FIG. 1 is an overall perspective view of a high speed discrete wire pin panel assembly with embedded capacitors, constructed in accordance with the present invention.

FIG. 1 illustrates a high speed discrete wire pin panel assembly, or logic panel, 10 of the present invention. The panel 10 includes a printed circuit board 12 formed by a core or board member 14 of insulative material and a pair of conductive layers 16, 18 lying on opposite faces of the board member, each conductive layer covering most of the corresponding surface of the board member, at least in the region containing integrated circuits. A large number of contacts 20 in the form of lead-receiving pins, such as two thousand of such pins, lie in the printed circuit board. Each pin 20 has a component side lying at an upper or component face 22 of the circuit board; a large number of integrated circuits or components 24 are designed to lie over the component face of the circuit board with their leads received in the pins. The circuit board also has a lower or wiring face 26, and the pins each have a wiring terminal at the wiring face 26. A large number of individual wires each extend between the wiring ends of the pins to interconnect them, to thereby interconnect the integrated circuits. The panel may also have a pair of connectors 30 at one edge, with terminals at the wiring face of the circuit board, to enable the panel with integrated circuits installed thereon, to be connected to external circuitry such as the data bus interfaces of a computer. The integrated circuits 24 may operate at high speeds, and it is desirable to construct the panel 10 with distributed decoupling capacitance that facilitates such high speed operation, while avoiding the introduction of even small amounts of inductance that might create unwanted resonances within the operating frequency range of the circuitry.

Figure 2:
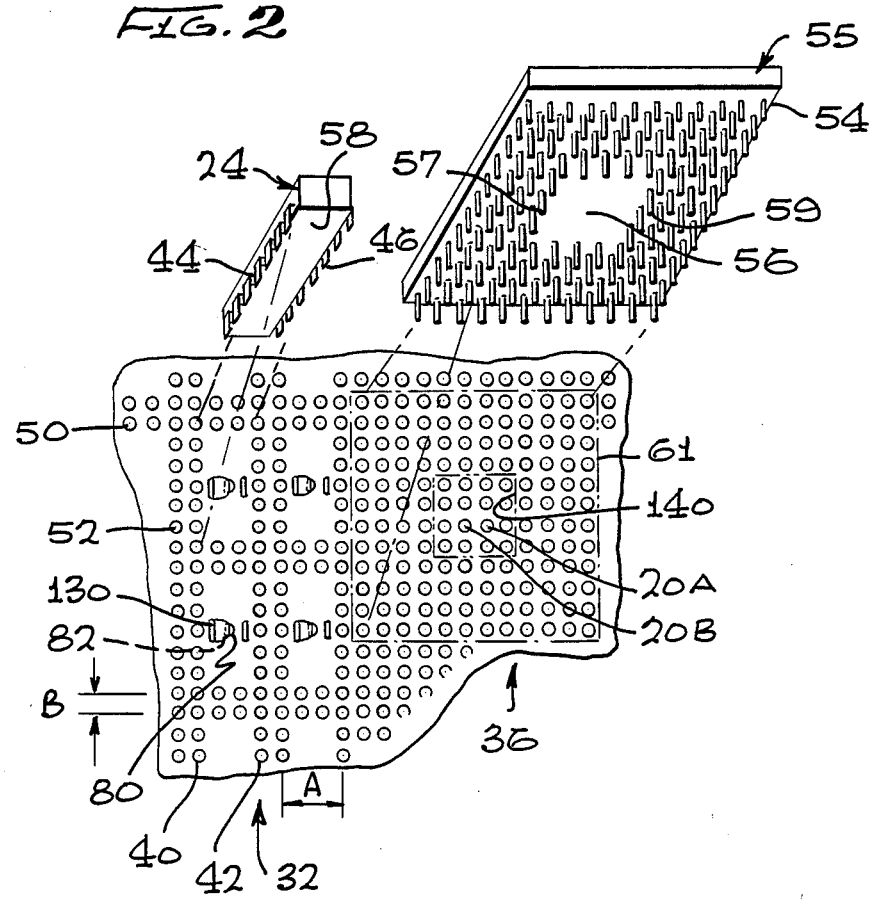
FIG. 2 is a plan view of a portion of the assembly of FIG. 1, and also showing a PGA (pin grid array) integrated circuit with a central pin-free area, which can be installed in the logic panel assembly.

The panel 10 may be constructed with a pair of dual-in-line sections 32, 34 where the very common dual-in-line integrated circuits are received, and with a PGA (pin grid array) section 36 where other types of leaded integrated circuits, especially very large scale integrated circuits having many rows of leads, can be received. As shown in FIGS. 2 and 3, the dual-in-line section 32 includes pairs of rows of pins, such as the pair of rows 40 and 42 spaced apart by a distance A of 0.3 inch, to receive the two rows of leads 44, 46 of a small size dual-in-line circuit 24. The individual pins along each row are spaced apart by a distance B of 0.1 inch, which is the standard lead-to-lead spacing for dual-in-line integrated circuits. Dual-in-line integrated circuits are also available with their rows of leads spaced by 0.6 inch, 0.9, and 1.2 inch. A 0.6 spacing of leads can be accommodated by rows 50, 52 spaced 0.6 inch apart. Different dual-in-line circuits have different numbers of leads. The PGA section 36 can accommodate large scale integrated circuits, which typically have between forty-four and two-hundred twenty or more leads. Such an integrated circuit is shown at 54. The leads are typically arranged with multiple rows of leads at each of the four sides of the integrated circuit. The center of the underside of the body 55 of the integrated circuit has a pin-free area 56 centered within the innermost rows of leads 57, 59. Similarly, the dual-in-line integrated circuit 24 has a pin-free area 58 lying between the two rows of leads. FIG. 2 shows a region 61 of the PGA section which includes one hundred forty-four pins 20 all uniformly spaced by distances B; the actual panel assembly illustrated and constructed by applicant contains a PGA section 36 of 24 rows and 73 columns for a total of 1,752 pins.

The high speed panel assembly, or logic panel, 10 is constructed to provide a capacitance under each dual-in-line integrated circuit 24. It is known that such decoupling capacitors, which connect the conductive layers or logic planes 16, 18, filter out noise especially at high signal rates with fast rise times (i.e., at high frequency rates). It is preferable that the capacitors be located physically as close as possible to each integrated circuit 24. A capacitance ranging from about 0.01 to 0.033 microfarads at about a 25 volt rating, is desirable adjacent to each integrated circuit. Ideally, no inductance should be introduced between a capacitor and either logic plane, as the resulting capacitor-inductor or LC combination has a natural resonant frequency. Operation of computer circuitry on the panel at a frequency near such a natural resonant frequency causes electrical noise and computer malfunction.

Figure 11:
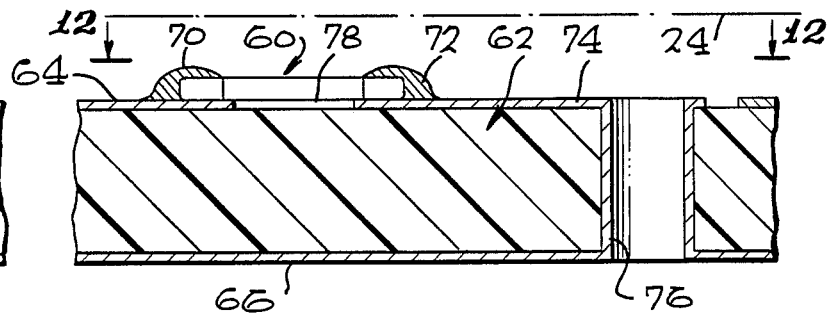
FIG. 11 is a sectional view an installed capacitor in a prior art logic panel.
Figure 12:
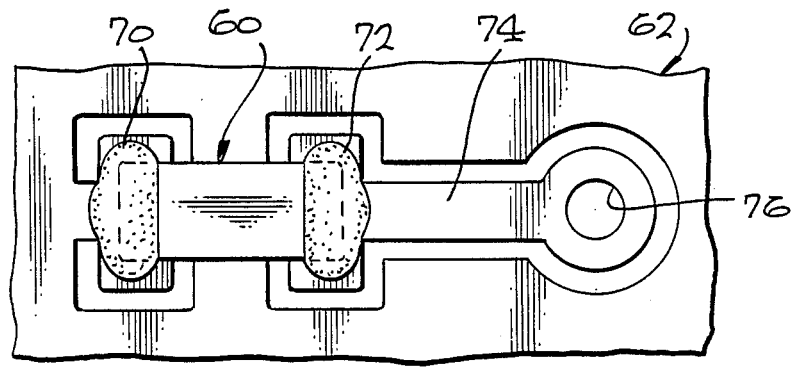
FIG. 12 is a view of the prior art taken on line 12—12 of FIG. 11.

FIGS. 11 and 12 illustrate a portion of a prior art logic panel, wherein a SMT (surface mounted) capacitor 60 was mounted over the component side of a printed circuit board 62 which had conductive logic planes 64, 66 at its opposite faces. The capacitor was attached by a soldered joint 70 to the component side conductive (voltage) plane, and was attached by another solder joint 72 to a conductive trace 74. The trace 74 extends along the component side of the board to a plated-through hole 76 that extends to the wiring side of the conductive (ground) plane 66. The capacitor 60 was generally mounted under an integrated circuit 24, with a thin gap 78 under the capacitor. While such a mounting arrangement had space-saving advantages, including the fact that SMT capacitors are presently readily available at low cost (about three cents each), it also resulted in many problems. Such problems included those resulting from cracked solder points caused by differential thermal expansion of the capacitors and the circuit board, and the expense of positioning and soldering the capacitors in place. The capacitors were subject to damage, as when a technician pried the integrated circuit 24 out of the socket pins for replacement, using a screwdriver that might press against the capacitor 60 and damage it. A serious problem encountered with prior logic panels of this type is that they operated satisfactorily to frequencies of about 90 MHz (megahertz), but that resonances developed above this frequency. In order to operate at higher frequencies, stripline or microstrip panels were required, which cost about ten times as much as the pin panels, and which must be designed with conductive traces suitable only for a specific circuit, rather than being very versatile with changeable discrete-wire interconnections. Applicant has found that resonances created at about 100 MHz were due to inductances resulting from current flowing through the plated-through holes 76 from the conductive traces 74 to the lower plane 66.

In accordance with the present invention, the commonly available SMT (surface mounted) capacitors of the leadless type are used, which are mounted in holes formed in the circuit board. As shown in FIGS. 3 and 4, a hole 80 is formed in the circuit board 12 under the pin-free body area 58 of an integrated circuit. The hole 80 includes aligned holes 80V, 80B, and 80G (FIG. 7) in the voltage plane, the board member, and the ground plane. A SMT capacitor 82 is placed in the hole. The SMT capacitor has a length L roughly equal to the thickness M of the circuit board, that is, the board thickness is within about 50% and preferably within 25% of the capacitor length, so the electrically conductive terminals 84, 86 of the leadless capacitor lie adjacent to the opposite metal foils or layers 16, 18 of the logic planes.

Figure 8:
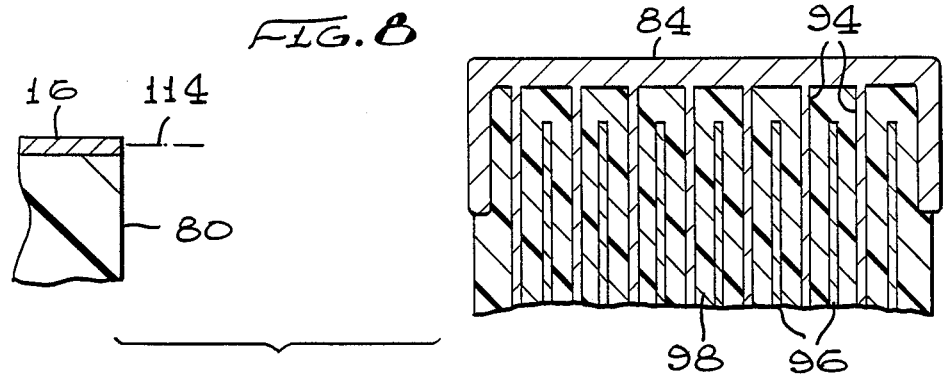
FIG. 8 is an enlarged view taken on the line 8—8 of FIG. 7.
Figure 10:
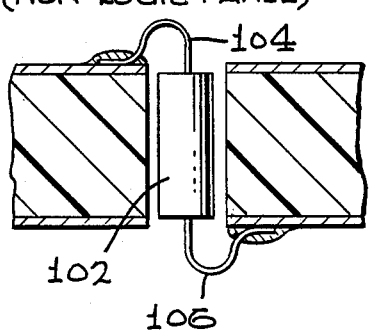
FIG. 10 is a partial sectional view of a prior art circuit board assembly which is not of the logic panel type.

As shown in FIGS. 5 and 8, the SMT type capacitor includes an elongated body 90 with a middle 92 whose outside is of insulative material, and which has opposite ends forming the terminals 84, 86. As shown in FIG. 8, the capacitor includes two groups of interfitting electrically conductive plates or films 94, 96 separated by a dielectric 98. The films 94, 96 extend in "cross-planes" that extend perpendicular to the logic panel planes 16, 18 when the capacitor is installed. Each capacitor terminal such as 84 is in the form of a conductive layer or conductive coating that interconnects the films 94 and provides a solder location. The capacitors are leadless, in that the terminals such as 84 are devoid of narrow elongated leads (leads whose length is over three times their width or thickness), such as those shown in the prior art FIG. 10 at 104, 106 for a capacitor 102 that is used in a printed circuit board with etched signal traces, and where the curved leads such as 104 produce significant inductance that considerably limits the frequency of operation of the circuit board assembly. It may be noted that any current flow along a group of capacitor films such as 94, results in an equal and opposite current flow along adjacent films 96, so the magnetic fields substantially cancel.

Each terminal such as 84, 86 of the capacitor is mechanically and electrically coupled to a different conductive layer 16, 18 by a flowable but hardenable electrically conductive bonding material, which may be referred to herein as solder.

The quantity of solder such as 110 (FIG. 5) connecting a capacitor terminal 84 to a logic plane 16, forms an electrically conducting path indicated at 112 which extends primarily in the plane 114 of the corresponding logic plane 16. That is, a substantially straight conductive path exists in the solder which extends by less than 45° between the terminal 84 of the leadless capacitor, and especially of the portion of the terminal that connects to the ends of the conductive films 94 of the capacitor, and the logic plane 16. Such a conductive path largely in the plane of the conductive plane 16, avoids a considerably narrow, curved path which would result in appreciable inductance. In addition, the thickness T and width W of the solder connection's rather bulky mass (each of which may be considered to be a cross-sectional width) are each greater than 25% of the length Z of the solder connection. This avoids the skin effect of thin wires such as 104 in FIG. 10, or of long but small-width traces etched in a conductive layer on the surface of the board, which results in an appreciable inductance at a high frequency such as above 100 MHz.

The most popular size of SMT capacitors is the JEDEC 1206 package size, wherein each capacitor has a length L of about 0.125 inch, a width W of about 0.062 inch, and a thickness T of about 0.023 inch. Such capacitors have a capacitance of about 0.01 microfarad and a voltage rating of 25 to 50 volts. Other SMT capacitors are available with the same length and width, but with the thickness increasing to about 0.044 inch for a capacitance of about 0.033 microfarad (though of smaller voltage rating). Typical logic panels include a printed circuit board 12 (including logic planes) of a thickness M of about 0.100 inch, but up to 0.125 inch. Since SMT capacitors are available at low cost, such as about 3 cents each, and provide considerable capacitance in a small volume, they are highly suitable in the present logic panel. The SMT capacitors installed as shown in the figures, do not occupy space that would otherwise be occupied, so a large number can be installed. The capacitors are protected from harm, especially during pry-out removal of a dual-in-line IC over them, because they are embedded. They can be mass loaded by vibrating a circuit board with capacitors on top until the capacitors fall into corresponding holes. The fact that the distance between the capacitor terminals is roughly the same as the thickness of the circuit board, enables direct electrical connection that avoid stray inductances.

The SMT capacitors generally have a length L slightly greater than the thickness M of the circuit board. The capacitors are installed with their terminals protruding slightly from opposite surfaces of the circuit board. Applicant finds that this aids in soldering, in that a quantity of heat-melted solder can be first flowed onto the adjacent surrounding conductive layer, then drawn quickly across to the protruding capacitor terminal to complete the solder connection. If the capacitor terminal lay below the surface of the conductive layer, it would be difficult to touch a quantity of solder to the capacitor terminal in a short enough time to avoid overheating the fragile capacitor.

The quantities of solder 110, 120 (FIG. 5) connecting the capacitor terminals 84, 86 to adjacent logic planes 16, 18 extend from each capacitor terminal to only one side 16s, 18s of the hole in the corresponding conductive layer. This leaves the opposite side 16t, 18t of each hole free of blockage by that quantity of solder. The resulting free portions 122, 124 that are not blocked by solder, allow a cleaning fluid to be washed through the holes to clean out any solder flux that may lie in the holes. Solder flux is used with heat-meltable solder, but is corrosive in humid environments, and if left in place will corrode the solder connection and surrounding metal surfaces. Even though the path through the hole 80 in the circuit board is partially blocked with the body of the capacitor, thorough flux washout is accomplished using conventional low-cost cleaning methods. Applicant prefers to have the two quantities of solder 110, 120 at the different terminals of a capacitor extend substantially from opposite sides of the axis 126 of the capacitor. This results in cleaning fluid flowing in a curved path through the hole and around the capacitor, which aids in washing out solder from all portions of the hole As shown in FIG. 4, applicant provides a pair of thermal relief slots 130, 132 on opposite sides of the capacitor-receiving hole 80. Each slot is spaced from the edge of a corresponding hole by a distance G about equal to the diameter of the hole, that is, between about one-half and twice the hole diameter. Each slot such as 130 preferably has a length at least about equal to the diameter of hole 80 and extends substantially parallel to an imaginary line 131 tangent to the adjacent edge of the hole. When a quantity of solder 110 is applied, it extends along the surface of the logic plane 16 up to the slot 130. The slot 130 prevents the solder from flowing further, and possibly contacting and short circuiting an adjacent pin 20. It may be noted that the slots also tend to prevent the rapid dissipation of heat from the region of the capacitor 82 during soldering. It also may be noted that voltage and ground pins 134, 136 are provided between each pair of rows which receive a dual-in-line circuit providing auxiliary wiring points for circuitry.

Figure 9:
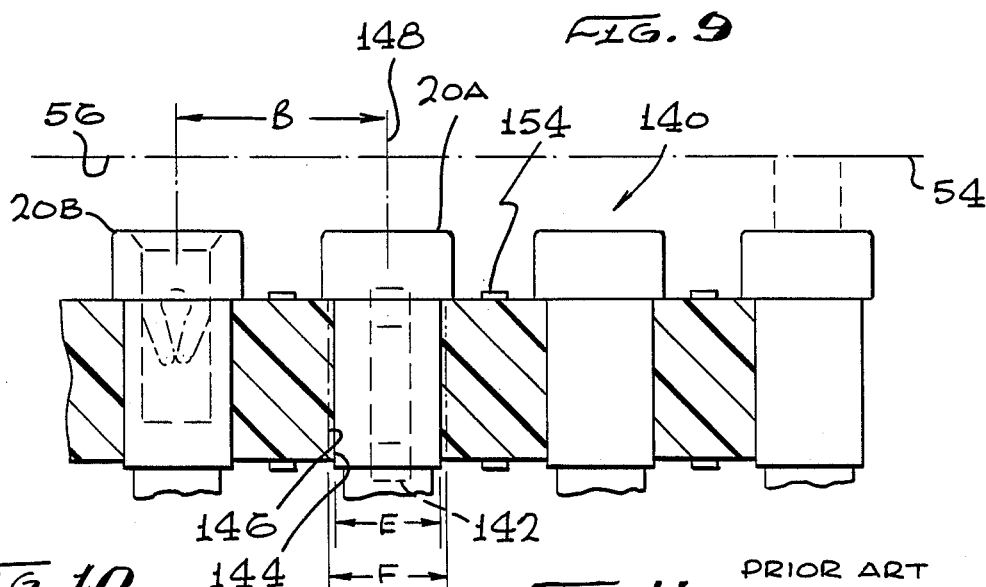
FIG. 9 is a sectional view of a portion of the circuit of FIG. 2.

Applicant constructs the pin panel assembly 10 so there is an embedded capacitor 82 (FIG. 2) under each region where a dual-in-line integrated circuit is designed to be received, which is in the sections 32, 34 of FIG. 1. It would also be desirable to provide a capacitor under each large scale PGA integrated circuit 54 (FIG. 2) under the pin-free space 56. However, the sizes and locations of the leads of such integrated circuits (IC's) vary considerably, so installing capacitors prior to knowledge of the particular IC placement scheme would require compromising logic panel versatility. Instead, applicant is able to install embedded capacitors in the already completed pin panel assembly. As shown in FIG. 9, which shows the region 140 of FIG. 2 that lies under the central pin-free area 56 on a particular large scale integrated circuit 54, applicant installs the capacitor 142 by first removing one of the pins 20A.

The pins 20 of standard size have been press fitted into pin-receiving holes 144 of a diameter E of about 0.056 inch. Applicant can easily remove individual pins by pressing them up and out of the hole. The hole is then redrilled to a diameter F of 0.067 inch to form an enlarged hole 146 to receive a SMT capacitor 142. The capacitor is placed or pressed into the hole and soldered in place to form a connection similar to those of the previously mass-installed capacitors. The axis 148 of the original and redrilled holes are coincident. Almost all holes (well over 95%) in the PGA section still contain pins. It may be noted that there are no slots adjacent to each pin-receiving hole, and care can be taken to avoid short circuiting an adjacent pin such as 20B. However, since the adjacent pin 20B lies under the pin-free space or "bald" spot of the integrated circuit and is not used, it does not really matter if the solder extends to it. Such adjacent unused pins may also be removed to make capacitor soldering easier. It is noted that the logic planes have holes 154 (FIG. 4) of greater diameter than the pin-receiving holes 144 (FIG. 9) so the pins do not contact the logic planes. The ability to install capacitors in the PGA region 36 of the pin panel assembly, also enables this section to hold additional dual-in-line integrated circuits, with each having its signals filtered by a capacitor lying directly beneath it. This feature enhances the logic panel's versatility.

Applicant has constructed and tested logic panel assemblies of the type illustrated. While the best previously available logic panels could operate only to a frequency of about 90 MHz, the illustrated logic panels constructed by applicant were found to operate without resonances up to 250 MHz. The tests were not extended above 250 MHz. It may be noted that the circuit board 14 can have the construction shown in FIG. 5 wherein there is an extra ground plane 150 and an extra voltage plane 152 respectively connected to the surface voltage and ground planes 16, 18, for carrying additional current; these additional logic planes do not otherwise affect operation of the logic panel.

Thus, the invention provides a logic panel with decoupling capacitors mounted with high ruggedness and reliability at low cost, and in a manner that avoids inductances to allow the logic panel and associated circuitry to operate at very high frequencies. The capacitors are leadless types with their opposite terminals at about the same height as the opposite logic planes of the panel, and are joined to the logic planes by solder that forms an electrical path extending primarily in the plane of the corresponding voltage or ground plane. The quantities of solder preferably extend to only one side of the capacitor-receiving hole, to leave the other side open so washout fluid can pass through the hole to wash out solder flux or any other deleterious material in the hole. While heat-softening solder is generally preferred, dryable or heat curing conductive material can be used and considered the equivalent of such solder. The capacitor preferably lies embedded in the logic panel, directly under the pin-free area on an integrated circuit, between pairs of rows of socket pins that receive the leads of the integrated circuit. Mounting the capacitor within the logic panel avoids damage to the capacitor if the integrated circuit is pried out. In a PGA (pin grid array) section of the logic panel wherein the pin contacts are arranged in a continuous array, a capacitor can be installed after the customer's circuit is designed, by pressing out a pin that would lie under the pin-free area of the integrated circuit, and (after redrilling the hole) installing a capacitor in the same location as that from which the pin was removed, and soldering the capacitor into place.

Although particular embodiments of the invention have been described and illustrated herein, it is recognized that modifications and variations may readily occur to those skilled in the art and consequently it is intended to cover such modifications and equivalents.

What is claimed is:

1. A high speed logic panel comprising:
    a board member of insulative material having upper and lower faces;
    voltage and ground conductive layers, each lying on and covering a majority of one of said board member faces and forming conductive planes on corresponding board faces;
    said board member and conductive planes having a multiplicity of aligned capacitor-receiving through holes;

a multiplicity of elongated leadless decoupling capacitors each having an elongated body with a middle and opposite ends and whose outside is insulative at said middle and which has electrically conductive layers at said ends forming capacitor terminals, each capacitor having a capacitance between said terminals, each capacitor lying in one of said holes with said terminals lying respectively adjacent to said voltage and ground conductive layers;

a quantity of solder extending between each capacitor terminal and an adjacent portion of a corresponding one of said conductive planes;

each capacitor includes two groups of interfitting conductive films extending in cross planes perpendicular to said conductive planes and merging with said terminals, and each quantity of solder forms a conductive path extending between a capacitor terminal and a conductive plane lying primarily in a corresponding one of said conductive planes.

2. The panel described in claim 1 wherein:
the conductive path formed by each of said quantities of solder between a capacitor terminal and an adjacent portion of a conductive plane, have a narrowest cross sectional width which is at least 25% of the length of said path.

3. The panel described in claim 1 wherein:
each quantity of solder extends from a capacitor terminal to only one side of the hole in the corresponding logic plane, to leave the opposite side of the hole in the same logic plane free of blockage, whereby to permit washout fluid to flow through the capacitor-receiving hole.

4. The panel described in claim 1 wherein:
each conductive plane has a slot spaced from a capacitor-receiving hole by about the diameter of the hole, and each quantity of solder extends from the hole up to the slot.

5. In a high speed logic panel which includes a board member of insulative material with opposite faces and voltage and ground conductive layers each lying on one of said faces and with said layers lying in parallel planes, the improvement wherein:
said board member has a plurality of capacitor-receiving through holes and said conductive layers have holes aligned with said board member holes, each of said conductive layer holes having first and second opposite sides;
a plurality of capacitors that each have a body with an insulative middle and opposite ends and with electrically conductive layers over its ends forming capacitor terminals, each capacitor lying in one of said board holes with its terminals lying adjacent respectively to said voltage and ground conductive layers;
a quantity of solder extending between each capacitor terminal and an adjacent conductive layer;
each quantity of solder extending from a capacitor terminal to only one side of the hole in the corresponding conductive layer, to leave the opposite side of the hole in the same conductive layer free of blockage by that quantity of solder, whereby to allow the flow of washout fluid completely through each of said capacitor-receiving holes after installation of a capacitor in the capacitor-receiving hole.

6. The improvement described in claim 5 wherein:
each capacitor has an axis extending between its ends; the two quantities of solder that each extend from a different capacitor terminal to a conductive layer, extend substantially from opposite sides of said axis, whereby to allow more complete cleaning of the capacitor-receiving holes by washout fluid.

7. The improvement described in claim 5 wherein:
each of said conductive layers has a slot therein spaced from the hole in the conductive layer on a side of the hole in the conductive layer to which the corresponding quantity of solder extends;
each of said quantities of solder extends to said slot, whereby to limit the area covered by each quantity of solder.

8. The improvement described in claim 7 wherein:
each of said slots has a length at least about equal to the diameter of the corresponding capacitor receiving hole, and extends substantially parallel to an imaginary line tangent to the adjacent edge of the hole.

9. The improvement described in claim 5 wherein:
each of said capacitors includes two groups of interfitting conductive films extending in planes perpendicular to the planes of said voltage and ground conductive layers, and said capacitor terminals lie substantially in said planes of said voltage and ground conductive layers; and
each of said quantities of solder forms an electrical path lying substantially in the plane of the corresponding conductive layer in extension between the corresponding capacitor terminal and conductive layer.

10. A high speed logic panel comprising:
a board member of insulative material having first and second opposite faces;
first and second conductive layers lying respectively over said first and second faces;
a plurality of pairs of rows of lead-receiving socket pins mounted in said board, the pins spaced apart by a first distance along each row and the rows of each pair being spaced apart by a second distance which is a plurality of times as great as said first distance to leave a board space between the rows;
a plurality of dual-in-line integrated circuits, each lying over one of said board spaces and having a pair of rows of terminals received in pins of said pairs of rows of pins;
plurality of holes in said circuit board, each lying in one of said board spaces that lies between a pair of rows of contacts;
a plurality of capacitors, each capacitor having a pair of opposite ends and a length as measured between its ends, each capacitor having a leadless conductive terminal at each end and a capacitance between said terminals;
each capacitor lying in one of said holes under one of said integrated circuits, with the opposite ends of the capacitor and the terminals thereat each lying adjacent to a different one of said conductive layers, and a quantity of solder extending directly between each of said terminals and an adjacent conductive layer and electrically and mechanically connecting the terminals to the conductive layers.

11. The panel described in claim 10 wherein:
each capacitor has multiple interfitting conductive films and dielectric material between adjacent films, and each of said terminals is in the form of a conductive coating lying over and interconnecting alternate films, and each quantity of solder forms an electrically conductive path extending primarily in the plane of one of said conductive layers between a capacitor terminal conductive coating and a corresponding conductive layer.

12. A high speed discrete wire logic pin panel comprising:
 a circuit board which includes a board of insulative material with opposite faces, and voltage and ground conductive layers each lying on a different one of said board faces, said circuit board having a pin grid array section forming a grid of multiple rows and columns of through holes, with the holes being uniformly spaced along each row and along each column;
 a multiplicity of lead-receiving pins, each lying in one of said holes;
 said grid array section including at least 12 columns of uniformly spaced holes and at least 12 rows of uniformly spaced holes, with at least 95% of all of said holes containing one of said pins;
 a plurality of integrated circuits, each lying over said grid array section and having a plurality of rows of leads lying in a corresponding plurality of rows of pins, each integrated circuit having a pin-free area devoid of leads and lying over a plurality of said holes;
 at least one of said holes lying under said pin-free area being devoid of a pin, but holding a capacitor with terminals lying respectively adjacent to said voltage and ground planes and connected thereto.

* * * * *